(12) United States Patent
Fries et al.

(10) Patent No.: US 6,414,441 B1
(45) Date of Patent: Jul. 2, 2002

(54) FLAT CARRIER WITH AN INDICATING DEVICE

(75) Inventors: Manfred Fries, Hunderdorf; Wolfgang Friess, Ansbach, both of (DE)

(73) Assignees: Infineon Technologies AG, Munich; Schreiner Etiquetten und Selbstklebetechnik GmbH & Co. KG, Oberschleissheim, both of (DE)

( * ) Notice: Subject to any disclaimer, the term of this patent is extended or adjusted under 35 U.S.C. 154(b) by 0 days.

(21) Appl. No.: 09/636,534

(22) Filed: Aug. 10, 2000

Related U.S. Application Data

(63) Continuation of application No. PCT/DE99/00364, filed on Feb. 10, 1999.

(30) Foreign Application Priority Data

Feb. 10, 1998 (DE) .......................... 198 05 282

(51) Int. Cl.⁷ .................................................. G09G 3/10
(52) U.S. Cl. ...................... 315/169.3; 235/380; 340/5.4
(58) Field of Search ........................... 315/169.3, 169.1; 313/510, 512; 235/380, 381, 382, 382.5; 340/5.4, 5.41, 5.42

(56) References Cited

U.S. PATENT DOCUMENTS

| | | | |
|---|---|---|---|
| 4,614,861 A | * 9/1986 | Pavlov et al. | 235/380 |
| 4,755,660 A | * 7/1988 | Nakano | 235/380 |
| 4,874,934 A | * 10/1989 | Nakahara et al. | 235/380 |
| 5,003,222 A | * 3/1991 | Washo | 313/511 |
| 5,066,893 A | * 11/1991 | Osada et al. | 315/169.3 |
| 5,705,888 A | 1/1998 | Staring et al. | |
| 5,880,934 A | * 3/1999 | Haghiri-Tehrani | 361/737 |
| 6,019,284 A | * 2/2000 | Freeman et al. | 235/380 |
| 6,045,043 A | * 4/2000 | Bashan et al. | 235/441 |
| 6,196,460 B1 | * 3/2001 | Shin | 235/380 |

FOREIGN PATENT DOCUMENTS

| | | |
|---|---|---|
| DE | 196 04 374 | 8/1997 |
| EP | 0392731 A2 * | 10/1990 |
| EP | 0 682 321 | 11/1995 |
| FR | 2 670 642 | 6/1992 |
| JP | 59009783 | 1/1984 |

* cited by examiner

*Primary Examiner*—Don Wong
*Assistant Examiner*—Ephrem Alemu
(74) *Attorney, Agent, or Firm*—Laurence A. Greenberg; Werner H. Stemer; Ralph E. Locher

(57) ABSTRACT

A flat carrier having a power supply, for example in the form of a coil. The carrier is characterized by an electroluminescent device that contains two flat electrodes lying above one another and an electroluminescent paste located between the electrodes. The electrodes of the electroluminescent device are connected to terminals of the power supply, which can be implemented, for example, as a coil or battery.

13 Claims, 5 Drawing Sheets

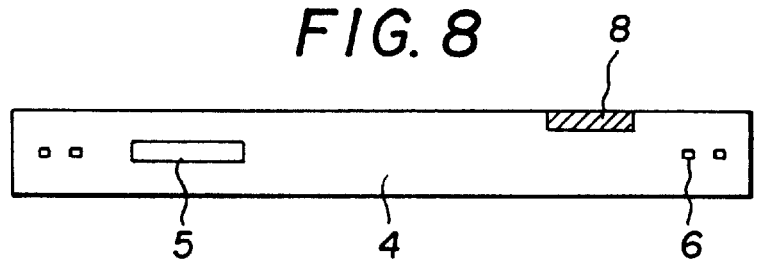
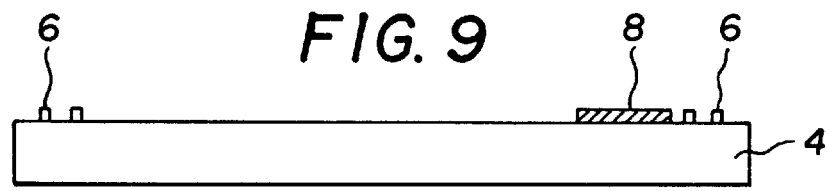
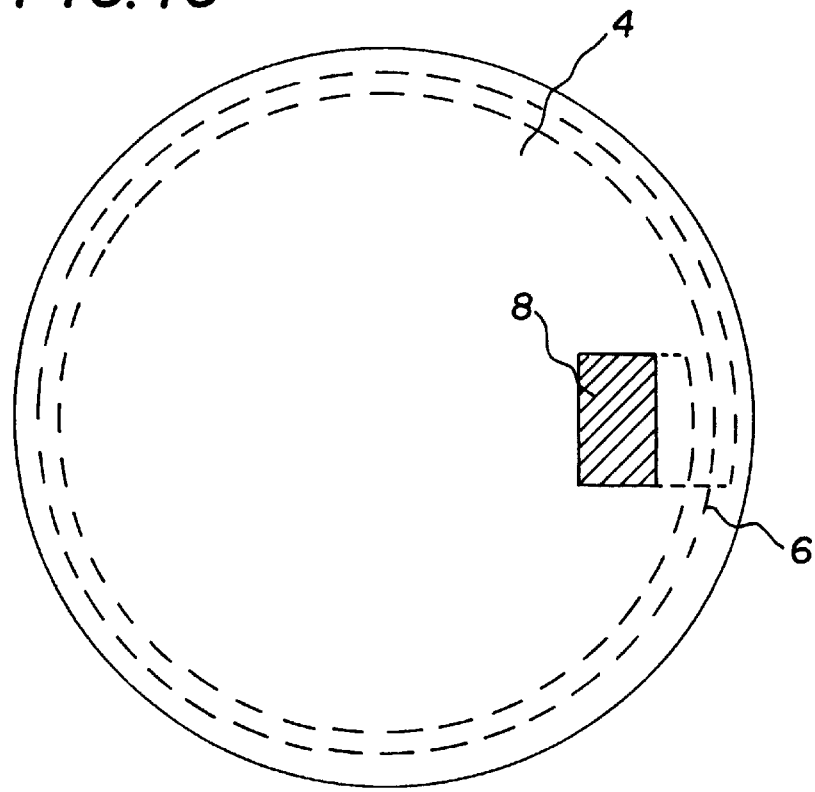

FLAT CARRIER WITH AN INDICATING DEVICE

CROSS-REFERENCE TO RELATED APPLICATION

This is a continuation of copending International Application PCT/DE99/00364/, filed Feb. 10, 1999, which designated the United States.

BACKGROUND OF THE INVENTION

FIELD OF THE INVENTION

The invention relates to a flat carrier having a power supply and an electroluminescent device.

Data carriers with integrated circuits are used in the form of credit cards, bank cards, cash payment cards and the like in an extremely wide range of service sectors, for example in cashless payment transactions or for access authorization within a company. Such a data carrier is generally composed of two layers, a module being provided which has at least one semiconductor chip and contact elements, and a power supply for the semiconductor chip being provided. In a large number of these data carriers, the power supply and/or the data exchange is carried out in contact with external devices via the external contact surfaces of an electronic module. Data carriers of this type have contact surfaces that are exposed in order to connect the data carriers to a read/write device. In this case, there is the risk of contamination of the contact surfaces, as a result of which, because of poor contact-making, it is possible for erroneous data transfer between the data carrier and the relevant read/write device of the terminal to occur. Irrespective of this, erroneous data transfer can also occur because of the erroneous positioning of the contact surfaces in the read/write device of the terminal.

Published, European Patent Application EP 0 682 321 A2 discloses data carriers which draw their energy and transfer data without contact, for example inductively. For this purpose, the data carrier has to be led past a read/write device at a specific distance, in order to permit the exchange of data. The range of the read/write devices is generally only a small distance. In addition, the user is not in a position to detect when a data transfer has taken place or not.

SUMMARY OF THE INVENTION

It is accordingly an object of the invention to provide a flat carrier with an indicating device that overcomes the disadvantages of the prior art devices of this general type, which informs the user about an operating state.

With the foregoing and other objects in view there is provided, in accordance with the invention, a flat carrier having a power supply with terminals. An electroluminescent device having two electrodes lying flat on each other is provided. The two electrodes are connected to the terminals of the power supply. Furthermore, an electroluminescent paste is disposed between the two electrode.

The invention is based on the idea that, on the flat carrier that has a power supply, an electroluminescent device is fitted. The electroluminescent device contains two electrodes lying flat on each other and an electroluminescent paste located between the electrodes. The electrodes of the electroluminescent device are connected to terminals of the power supply of the carrier.

This configuration ensures that at least two operating states, namely "in operation" and "not in operation" can easily be detected. The use of the electroluminescent device specified as an indicating device is simple and cost-effective and can be produced in virtually any form. The electroluminescent devices have a low current demand, are easy to handle and flexible and can be produced from thick-layer pastes that can be screen-printed. This ensures a low overall height of the electroluminescent device. Electroluminescent devices contain, for example, polymer thick-layer pastes that are conductive and can be screen-printed, or etched copper tracks, which are built up as a capacitor structure. In this case, the electroluminescent light-active pastes contain microencapsulated luminescent materials that are dispersed in a polymer matrix. In the case of a layer structure, the pastes are placed between the two electrodes, of which one is formed by a transparent, conductive layer. The finished electroluminescent device is a flexible film that is operated with alternating current.

The power supply of the electroluminescent device can be of a different type, depending on the carrier used. In the case of a carrier operating without contact, the electroluminescent device located on the carrier draws power from the coil, which is coupled in inductively by a read/write device. The electroluminescent device is supplied with alternating voltage via the coil of the carrier. Since the coil can provide power only when the carrier is located in the active range of a read/write device, the electroluminescent device can illuminate only when it is in the active range. This could be applied, for example, when the contact-free carrier was being used as a visible check of an access authorization. The excitation of the electroluminescent device with a specific voltage and frequency must in this embodiment be ensured by the read/write device acting from outside.

If the necessary voltage and frequency of the electroluminescent device cannot be impressed by the read/write device, then a device between the electroluminescent device and the power supply has to be provided for this purpose, and then provides the voltage and frequency needed by the electroluminescent device. This is the case, for example, when the carrier is used in an advantageous refinement as a data carrier in the form of a chip card. Such a data carrier has a module, the module has at least one semiconductor chip and contact elements. The task of providing the necessary voltage and frequency is performed by a so-called inverter, which is provided in integrated form and is advantageously accommodated in the module.

In addition, the module can have an intelligent semiconductor chip, which is provided for transferring or determining data. The inverter can be implemented as a separate semiconductor chip, or can advantageously be integrated into the intelligent semiconductor chip provided for transferring or determining data. It is also conceivable for the coil that supplies the intelligent semiconductor chip to be used at the same time as a power supply for the inverter and the electroluminescent device as well. However, the electroluminescent device and inverter can also be supplied via their own coil.

If the power which the coil of a data carrier supplies should not be sufficient to supply the electroluminescent device and/or the semiconductor chip, an energy store, for example in the form of a battery, can be provided on the data carrier and provide the missing energy difference.

In the following text, the term "power supply" implies both the power supply present in a specific form and also the inverter which may possibly be needed.

If the electroluminescent device is connected directly or via the inverter to the terminals of a power supply, then the indicator merely shows that the carrier is located in the active range of the read/write device. However, there is also the possibility that the electrodes of the electroluminescent device, in an advantageous refinement, are connected to the intelligent semiconductor chip located on the carrier. In this case, the illumination of the electroluminescent device can be controlled by specific logic states of the intelligent semiconductor chip. Of course, it is also possible for a number of electroluminescent devices to signal different states.

In this case, the intelligent semiconductor chip also at the same time performs the function of the inverter for driving the power supply of the electroluminescent device. It is also conceivable for the intelligent semiconductor chip and the inverter to be implemented as two semiconductor chips, the interconnection of the two semiconductor chips being performed, for example, by conductor tracks or wires. The electroluminescent device and the contact elements of the semiconductor chip can be connected, for example, by conductor tracks.

In a further refinement, it is also conceivable for the electroluminescent device, whose size on the data carrier can be varied, to be used as a background illuminating device for a display device, for example a liquid crystal display (LCD).

The carrier according to the invention contains at least one layer. If the carrier is built up from only one layer, the module, the power supply and the electroluminescent device are encapsulated with a plastic, so that the electroluminescent device is visible from the outside on one side. The electrical connections are in this case produced before the encapsulation. If the carrier contains a number of layers, then these prefabricated layers are laminated above one another in a suitable way.

The flat carrier according to the invention is further characterized by the fact that the electroluminescent device is covered by a transparent covering layer, which forms the topmost layer of the carrier. This brings with it the advantage that the electroluminescent device cannot be damaged by external influences. The areas outside the electroluminescent device can be covered by color printing on the transparent film.

It is also conceivable to dispose the electroluminescent device on the outside of the covering layer of the carrier. This has the advantage that the covering layer of the carrier does not need to be transparent, and can be implemented as a printed layer. In this case, the covering layer must have connecting elements, for example holes, in order that an electrical connection can be produced to the electrodes of the electroluminescent device in order to supply power to the carrier.

In an advantageous embodiment of the carrier, the electroluminescent device is fitted on the same layer as the module which has the at least one semiconductor chip and the contact elements. The advantage is that the production of the carrier, which contains a number of layers, can be carried out in the usual way. A modified production step is restricted to the production of the inlay on which the module and, in the case of a contact-free carrier, the coil are fitted. If the electroluminescent device is additionally fitted to this inlay, then the fitting of the electrical supply to the electrodes is particularly simple, since in this layer only conductor tracks from the power supply to the electrodes have to be provided. During the subsequent carrier construction, however, it must be ensured that the electroluminescent device is not covered by a non-transparent layer. The layer located above it must either be a transparent covering layer or else have a transparent window at the locations of the electroluminescent device. If a number of layers should be fitted over the inlay, then either all the layers have to be transparent or have a transparent cutout at least at the locations at which the electroluminescent device is fitted.

In a further refinement of the carrier, the electroluminescent device is on a different layer than the module. If the semiconductor chip and the electroluminescent device are to be connected to each other, then at least that layer on which the electroluminescent device is fitted, and the layer on which the module is fitted, must have connecting elements and/or conductor tracks. If there are further layers between the layer with the electroluminescent device and the layer with the module, then these layers must also have connecting elements or conductor tracks. If the electroluminescent device is fitted to a different layer than the module, this brings with it the advantage that semiconductor chip and electroluminescent device can be supplied with energy by a separate coil located in the respective layer. The coils are advantageously not located above one another, in order not to have any mutual influence on each other.

Other features which are considered as characteristic for the invention are set forth in the appended claims.

Although the invention is illustrated and described herein as embodied in a flat carrier with an indicating device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 is a sectional view of the carrier that contains one layer;

FIG. 9 is a sectional view of the single-layer carrier;

FIG. 10 is a plan view of the single-layer carrier shown in FIG. 9;

DESCRIPTION OF THE PREFERRED EMBODIMENTS

Figure 1:
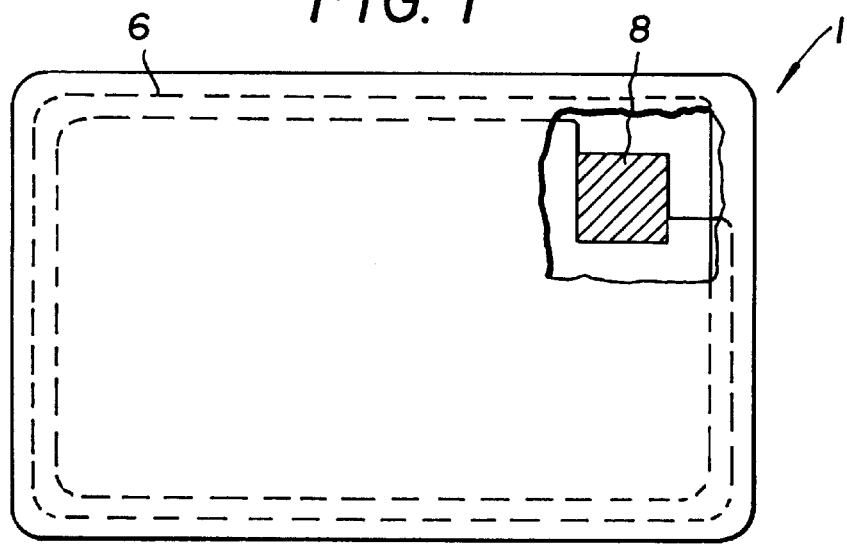
FIG. 1 is a diagrammatic, partly cut-away, plan view of a carrier in the form of a chip card with an electroluminescent device according to the invention.

In all the figures of the drawing, sub-features and integral parts that correspond to one another bear the same reference symbol in each case. Referring now to the figures of the drawing in detail and first, particularly, to FIG. 1 thereof, there is shown a plan view of a carrier 1 in the form of a chip card which operates on a contact-free principle by use of a coil 6. In this case, the coil 6 serves to supply a semiconductor chip 10 (FIG. 3) located on the data carrier 1 with power, and to perform an exchange of data. In addition, the coil 6 provides power to an electroluminescent device 8 located on the carrier 1. The electroluminescent device 8 is implemented in a form of a flat rectangle, but can also have another shape. Electrodes 12 (FIG. 12) of the electroluminescent device 8 are connected to the coil 6 via an inverter (for example integrated in the semiconductor chip 10), so that the electroluminescent device 8 begins to light up when the data carrier 1 enters an active range of a read/write device.

Figure 2:
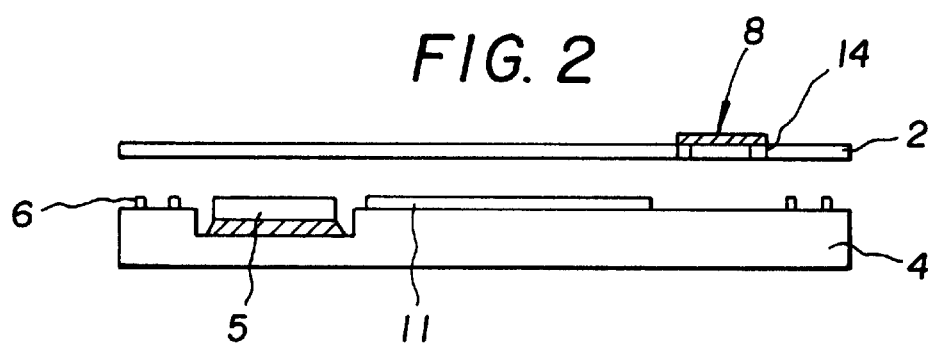
FIG. 2 is an exploded, sectional view of a two-layer carrier with the electroluminescent device on an outside of a covering layer.
Figure 5:
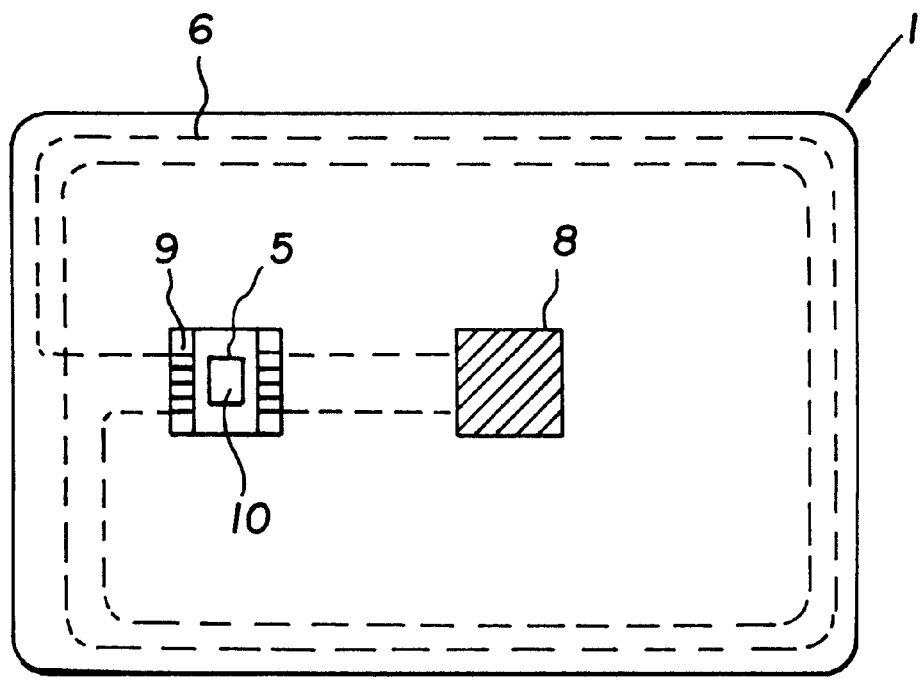
FIG. 5 is a plan view of the carrier in the form of a chip card, the electroluminescent device and the module being connected via conductor tracks.

FIG. 2 shows the carrier 1 of FIG. 1 in cross section, the carrier 1 being built up from two layers 2, 4. A module 5 and the coil 6 are fitted in a base layer 4. The module 5 contains the semiconductor chip 10 that has the function of the integrated inverter, and contact elements 9 (FIG. 5). The coil 6 provides power to both the module 5 and to the electroluminescent device 8, which is located on an outside of a covering layer 2. The electrodes 12 of the electroluminescent device 8 are connected electrically to the coil 6 located on the base layer 4 via connecting elements 14, which are fitted in the covering layer 2. In the exemplary embodiment, the module 5 is accommodated in a recess.

Figure 3:
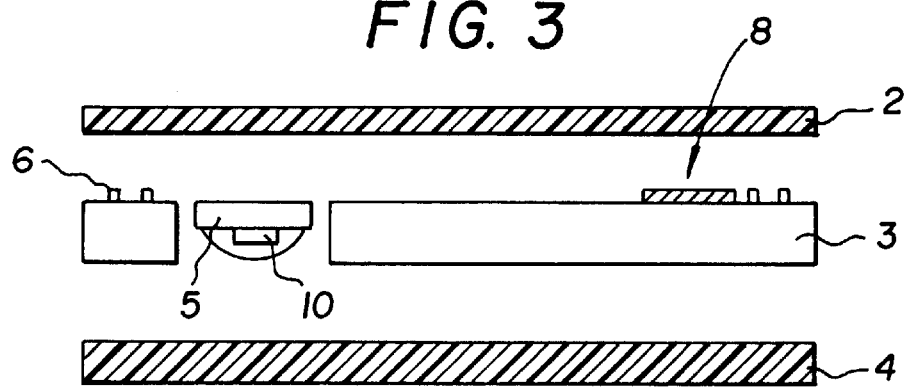
FIG. 3 is an exploded, sectional view of a three-layer carrier, a module and the electroluminescent device being in the same layer.

FIG. 3 shows a second embodiment of the carrier 1 according to the invention in cross section. The module 5 and the electroluminescent device 8 are fitted in one plane with an intermediate layer 3. In this case, the data carrier 1 is built up from the cover layer 2 which is a transparent covering layer 2, the intermediate layer 3 on which the module 5, the electroluminescent device 8 and the coil 6 are located, and the base layer 4. The module 5, which has the semiconductor chip(s) 10 and the contact elements 9, is located in a recess in the intermediate layer 3. In this case, the precise fitting of the module 5 in the intermediate layer 3 is carried out on the basis of the module construction in the usual way. The electrical supply to the module 5 and the electroluminescent device 8 is provided by the coil 6 located on the intermediate layer 3. However, it is also conceivable for the electroluminescent device 8 to be connected via conductor tracks to the contact elements 9 of the module 5, in order in this way to indicate logic states of the semiconductor chip 10. The covering layer 2 serves to protect both the electroluminescent device 8 and the coil 6 and the module 5.

Figure 4:
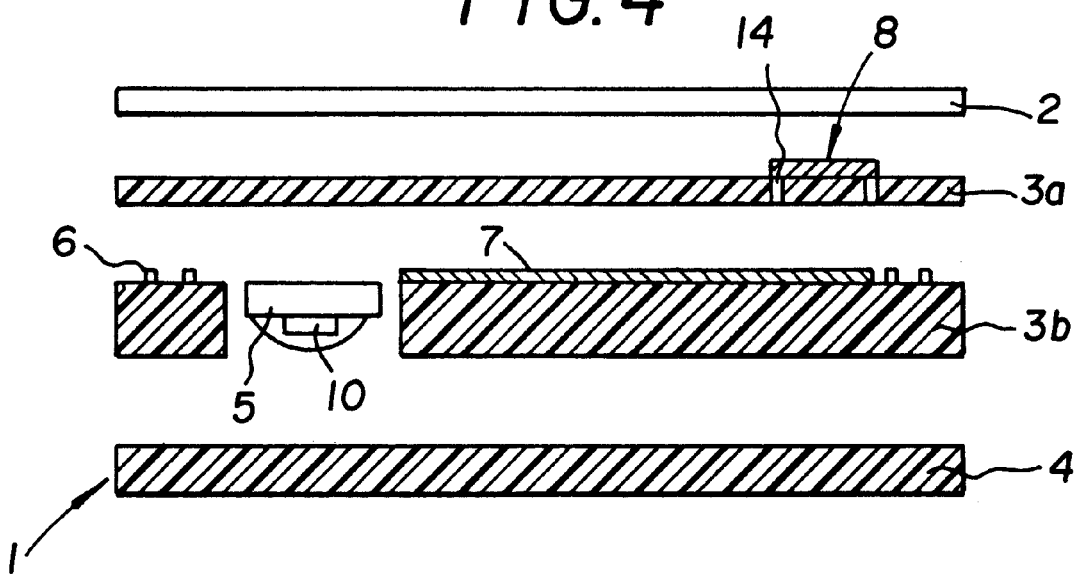
FIG. 4 is an exploded, sectional view of a four-layer carrier, the module and the electroluminescent device being on different layers.

FIG. 4 shows a cross section of a third embodiment of the carrier 1 according to the invention, the module 5 and the electroluminescent device 8 being located on different layers 3a, 3b. A first intermediate layer 3b, on which the coil 6 and the module 5 are located, constitutes an inlay known in the production of data carriers. The electroluminescent device 8 is located on a second intermediate layer 3a, and is connected to the contact elements 9 of the semiconductor chip 10 located in the module 5 via the connecting elements 14, for example holes metallized at the edge, in the second intermediate layer 3a, and by conductor tracks 7 which are located on the intermediate layer 3b. On the side on which the electroluminescent device 8 is located, the carrier 1 is closed off by the transparent covering layer 2, and on the opposite side it is closed off by the base layer 4.

The embodiments of the carrier 1 shown in FIGS. 2 to 4 have the common factor that they are implemented in the form of a chip card, and that the power supply is ensured by the coil 6. However, it is conceivable for an energy store 11 (FIG. 2), for example in the form of a battery 11, to be fitted to the carrier 1 in addition to the coil 6. It is likewise conceivable that the contact elements 9 of the module 5 on the upper side of the carrier 1 to be accessible from the outside, in order to perform the exchange of data with contact, or the supply of power with contact. In this case, the carrier 1 in the form of the chip card is implemented as a hybrid data carrier.

If the electroluminescent device is connected electrically only to the power supply, then in this case it is used to indicate whether contact with the read/write device has been produced. If the contact elements 9 of the module 5 and of the intelligent semiconductor chip 10 are connected to the electrodes 12 of the electroluminescent device 8, for example by the conductor tracks 7 and/or connecting elements 14, then the electroluminescent device 8 can, for example, signal transfer of specific data, for example relating to a transaction.

Figure 6:
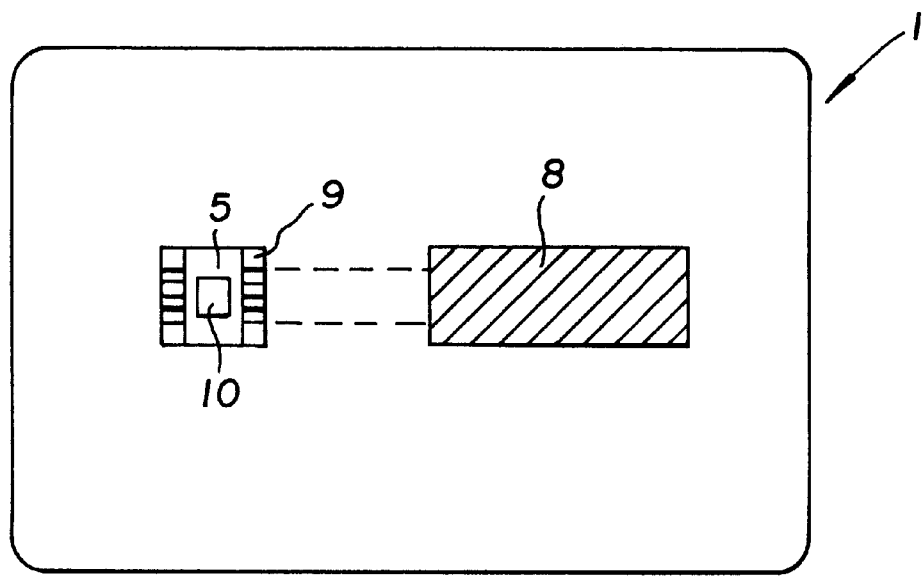
FIG. 6 is a plan view of the carrier in the form of the chip card, an electrical supply being provided with contact via external contact elements.
Figure 7:
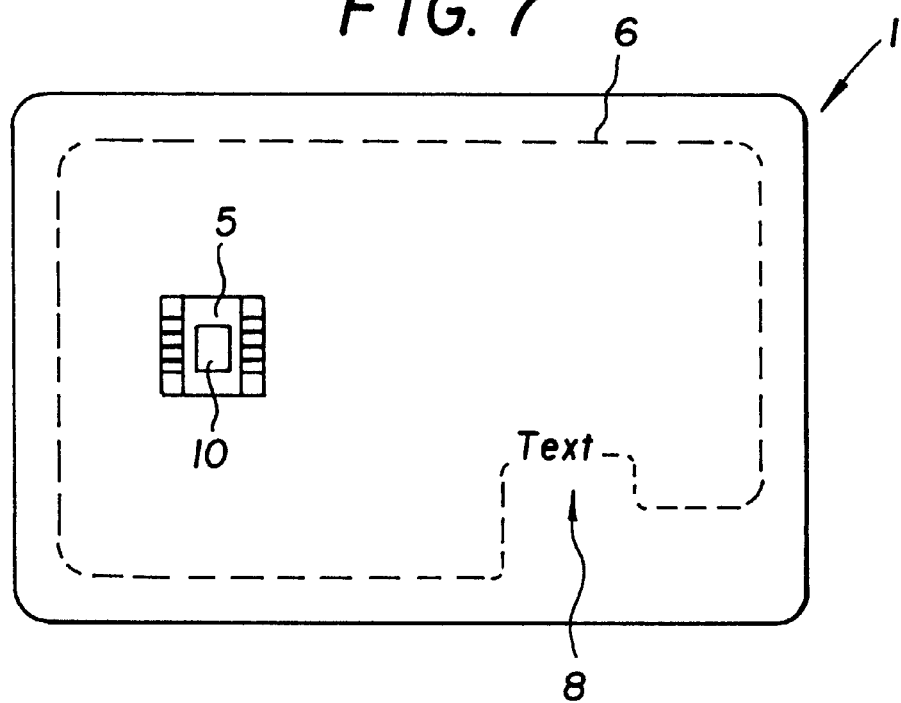
FIG. 7 is a plan view of the carrier in the form of the chip card, the electroluminescent device being implemented as a line of text.

FIGS. 5 to 7 show further variants of the data carrier 1 according to the invention.

FIG. 5 illustrates the carrier 1 which has the module 5 with the contact elements 9 being accessible on the upper side of the carrier 1, which is located on the outside. The carrier 1 then constitutes a hybrid module, since the coil 6 for the contact-free transfer of energy or data is provided. The coil 6 is connected to the contact elements 9 of the module 5. The electroluminescent device 8 is connected via the conductor tracks 7 to the contact elements 9 of the module 5 or the semiconductor chip 10, in order in this way to indicate specific logic states. It is also conceivable for only the power supply to be provided via the contact elements.

FIG. 6 illustrates the carrier 1 having contacts, in which the energy supply or the transfer of data is carried out exclusively by the contact elements 9 of the module 5 that is accessible from outside. In this case, the electroluminescent device 8 is in turn connected via the conductor tracks 7 to the contact elements 9 of the module 5, in order to indicate logic states of the semiconductor chip 10 or else to indicate the supply of power.

Figure 11:
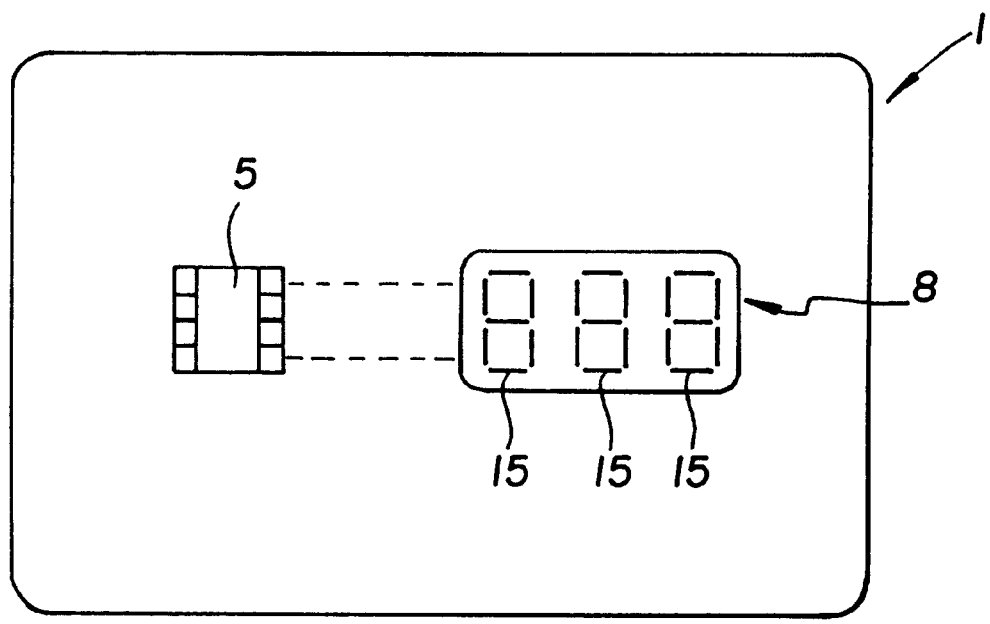
FIG. 11 is a plan view showing the electroluminescent device in a form of an LCD display.

FIG. 7 shows a plan view of the carrier 1, in which the electroluminescent device 8 is not implemented in flat form but in the form of a line of text. The shape of the electroluminescent device 8 can be any desired, as long as suitable fitting of the electrodes 12 of the electroluminescent device 8 is ensured. The implementation of the electroluminescent device 8 as a line of text could be used, for example, for advertising purposes. It is also conceivable for the electroluminescent device 8 to be used as background lighting, for example for an LCD display 15 (FIG. 11). As shown in FIG. 11, the electroluminescent device 8 can be in the form of a seven-segment display 15. For instance, in the case of a telephone card, this could indicate the credit still available on the card.

FIG. 8 shows an embodiment of the carrier 1 having one layer, the module 5, the power supply 6 in the form of the coil 6 and the electroluminescent device 8 being encapsulated in plastic. The electroluminescent device 8 is in this case visible from outside on one side of the carrier 1. The electrodes 12 (not visible) of the electroluminescent device 8 are, for example, connected to the contact elements 9 (not visible) of the module 5.

FIG. 9 shows a particularly simple embodiment of the carrier 1 according to the invention in cross section. The carrier 1 includes the single layer 4, the coil 6 and the electroluminescent device 8 being fitted to one side of the carrier 1. The electrodes 12 (not shown) of the electroluminescent device 8 are in this case connected to the coil 6. The voltage and frequency needed to excite the electroluminescent device 8 must be impressed from outside by the read/write device, since this embodiment does not have any inverter for the correct setting of voltage and frequency.

FIG. 10 shows the carrier 1 according to the invention from FIG. 9 in plan view. The shape of the single layer 4 is round in this case. The coil 6, which is connected to the electrodes 12 (not shown) of the electroluminescent device 8 is implemented close to the circumference of the single layer 4, for example as a printed conductive paste.

Figure 12:
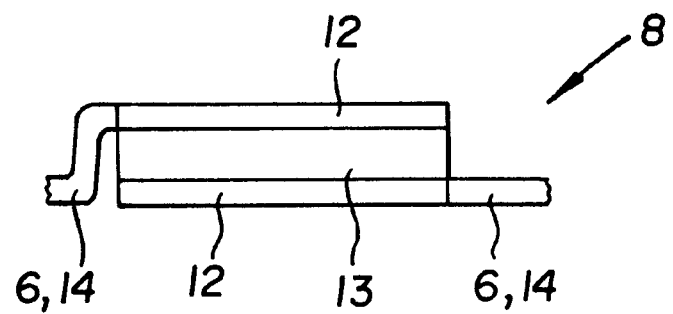
FIG. 12 is a fragmented, sectional view of the electrodes of the electroluminescent device.

FIG. 12 shows a detailed view of the electrodes 12 of the electroluminscent device 8. The electrodes 12 are disposed one above the other and have an electroluminescent paste 13 disposed in-between. The electrodes 12 can be connected directly to the coil 6 or to the connecting elements 14 and then to the coil 6.

The carrier 1 according to the invention does not have to be restricted to the representations shown in the figures. Any known carrier type that concerns the implementation of the layers located above one another can be implemented with an electroluminescent device. The electroluminescent device 8, which is applied as a thick-layer paste, can be used flexibly because of its limited thickness. Because of the simple production technology of an electroluminescent device, cost-effective and efficient installation is possible without having to undertake major changes in the basic structure of a carrier.

Furthermore, the shape of the carrier 1, in addition to the rectangular form shown, can assume any other conceivable geometric expression (for example square, round and so on).

We claim:

1. A flat carrier, comprising:

a power supply having terminals;

an electroluminescent device having two electrodes lying flat on each other and connected to said terminals of said power supply, said electroluminescent device displaying an operating condition of the flat carrier only when the flat carrier is located in an active region of a read/write device, the operating condition being dependent on an event occurring externally to the flat carrier; and an electroluminescent paste disposed between said two electrodes.

2. The flat carrier according to claim 1, wherein said power supply has at least one coil.

3. The flat carrier according to claim 1, including a module having at least one semiconductor chip and contact elements, said electrodes of said electroluminescent device connected to said semiconductor chip, and said semiconductor chip connected to said terminals of said power supply.

4. The flat carrier according to claim 3, including conductor tracks connecting said electrodes of said electroluminescent device to said contact elements of said module.

5. The flat carrier according to claim 3, including a support layer on which said electroluminescent device and said module are disposed.

6. The flat carrier according to claim 3, including:

a first layer on which said electroluminescent device is disposed; and a second layer on which said module is disposed, said first layer and said second layer having connecting elements and conductor tracks interconnecting said module and said electroluminescent device, and said first layer and said second layer are disposed above one another.

7. The flat carrier according to claim 1, including a transparent covering layer covering said electroluminescent device.

8. The flat carrier according to claim 1, including:

a transparent covering layer having an outer side, said electroluminescent device disposed on said outer side of said transparent covering layer; and connecting elements disposed in said transparent covering layer and connecting said electroluminescent device through said transparent covering layer to said power supply.

9. The flat carrier according to claim 1, wherein said electroluminescent device is an illuminating device for a display device.

10. The flat carrier according to claim 1, wherein said power supply has a storage device.

11. The flat carrier according to claim 1, wherein said power supply has at least one coil and a storage device.

12. The flat carrier according to claim 1, including a cardshaped body housing said power supply, said electroluminescent device, and said electroluminescent paste, and said power supply, said electroluminescent device, and said electroluminescent paste define a data carrier.

13. The flat carrier according to claim 1, wherein said electroluminescent device is a seven-segment display.

* * * * *